United States Patent [19]
Uchiyama et al.

[11] Patent Number: 6,065,615
[45] Date of Patent: May 23, 2000

[54] VERTICAL WAFER BOAT

[75] Inventors: Taroh Uchiyama, Takasago; Takashi Tsukamoto; Jiro Nishihama, both of Yokohama, all of Japan

[73] Assignee: Asahi Glass Company, Ltd., Tokyo, Japan

[21] Appl. No.: 08/805,227

[22] Filed: Feb. 24, 1997

[30] Foreign Application Priority Data

Feb. 28, 1996 [JP] Japan .................................. 8-067357

[51] Int. Cl.⁷ .................................................. A47F 7/00
[52] U.S. Cl. ...................... 211/41.18; 206/454; 118/500; 118/724
[58] Field of Search ........................ 211/41.18; 118/500, 118/724, 728; 206/454; D13/182; 414/935

[56] References Cited

U.S. PATENT DOCUMENTS

| | | | |
|---|---|---|---|
| D. 409,158 | 5/1999 | Shimazu | D13/182 |
| 5,458,688 | 10/1995 | Watanabe. | |
| 5,534,074 | 7/1996 | Koons | 206/454 X |
| 5,752,609 | 5/1998 | Kato et al. | 211/41.18 |
| 5,858,103 | 1/1999 | Nakajima et al. | 211/41.18 X |

FOREIGN PATENT DOCUMENTS

| | | |
|---|---|---|
| 0 506 052 | 9/1992 | European Pat. Off. . |
| 6-105693 | 12/1994 | Japan . |

OTHER PUBLICATIONS

Patent Abstracts of Japan, vol. 96, No. 8, Aug. 30, 1996, & JP 08 102446, Apr. 16, 1996.

*Primary Examiner*—Robert W. Gibson, Jr.
*Attorney, Agent, or Firm*—Oblon, Spivak, McClelland, Maier & Neustadt, P.C.

[57] ABSTRACT

A pair of annular end plates and a plurality of bars which are made of silicon carbide are formed in an integrally coupled/joined structure, having an entire length of not less than 800 mm. The end plates are unitary annular plates. Padding of silicon carbide is formed at a coupled/joined portion between an end plate and a bar so that the coupled/joined portion exhibits an obtuse corner.

26 Claims, 3 Drawing Sheets

FIGURE 2(a) FIGURE 2(b)
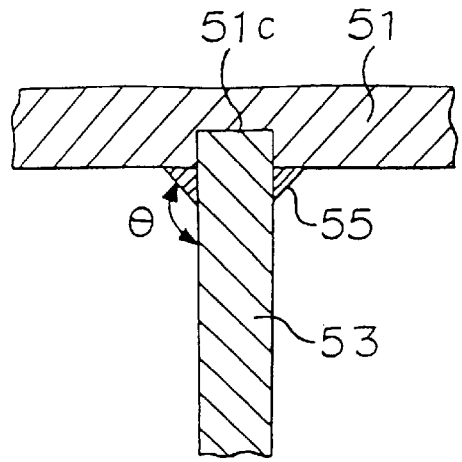
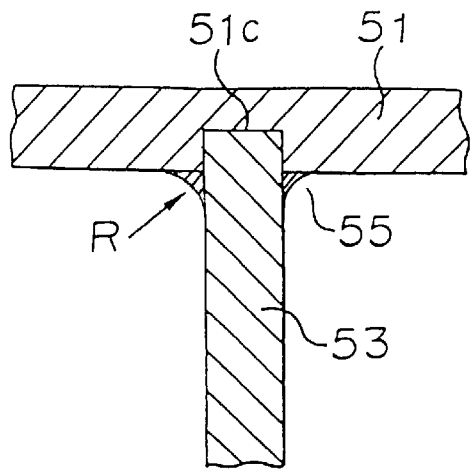
PRIOR ART FIGURE 3
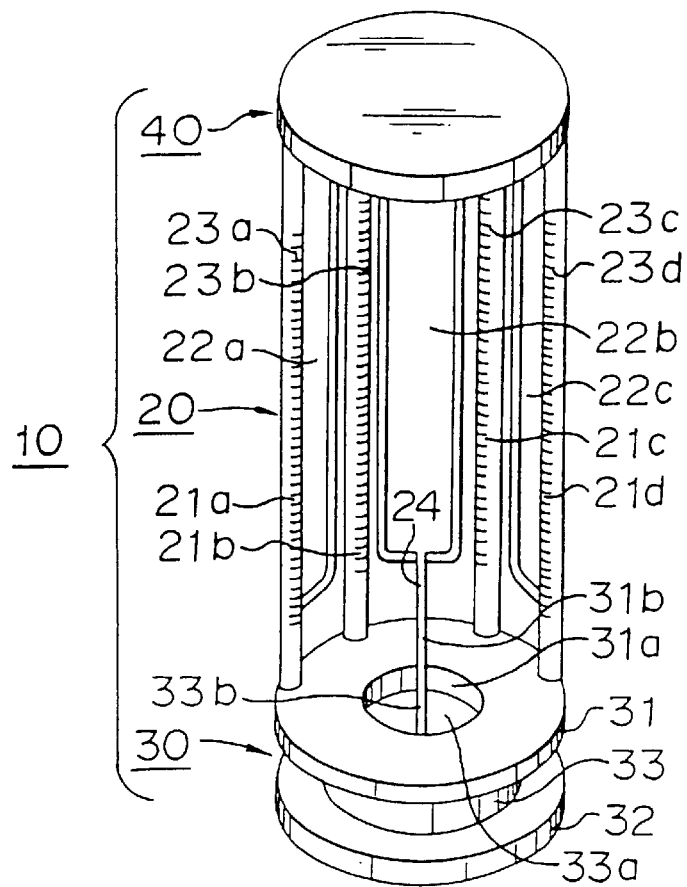

VERTICAL WAFER BOAT

BACKGROUND OF THE INVENTION

1. Field of the Invention

The present invention relates to a vertical wafer boat which is used to support semiconductor wafers when the semiconductor wafers are put into a vertical heat treatment furnace such as a low pressure CVD (chemical vapor deposition) system.

2. Discussion of the Background

Semiconductor wafers are put into various kinds of heat treatment furnaces for treatment such as oxidation, diffusion and thin film deposition. A wafer boat has been used as a supporting tool to support numbers of semiconductor wafers for entry into and takeout from a heat treatment furnace. It is known that such a wafer boat is classified according to the structure of heat treatment furnaces into a horizontal boat for entry of semiconductor wafers into and takeout from a furnace through a lateral side of the furnace, and a vertical boat for entry of semiconductor wafers into and takeout from a furnace through an upper end or a lower end of the furnace.

Most of low pressure CVD systems which are used to form e.g. a silicon nitride film on a surface of semiconductor wafers are vertical. Numbers of semiconductor wafers which are inserted in and supported by a vertical wafer boat have been put from beneath into a reaction chamber kept at 400–850° C. for treatment. This means that the wafer boat is subjected to repeated thermal stress due to a reciprocation between the reaction chamber at a high temperature and the outside at a low temperature.

Vertical heat treatment furnaces such as low pressure CVD systems have an inlet at a lower end thereof formed with a cooling unit such as a water jacket in some cases. A great difference in temperature between a lower portion and an upper portion of the wafer boat might be created to have fear of failure due to thermal stress. This necessitates use of a wafer boat which has a lower end provided with a pedestal having a height of not less than 5 cm for shielding heat-radiation with respect to a wafer boat for elongated vertical heat treatment furnaces.

As such a vertical wafer boat, e.g. the structure shown in FIG. 3 has been disclosed in JP-B-94105693. The wafer boat 10 in the publication includes a jig body 20 made of silicon carbide, a lower plate 30 made of silicon carbide coupled to a lower end of the jig body 20 by a suitable way such as bonding or engagement, and an upper plate 40 made of silicon carbide coupled to an upper end of the jig body 20 by bonding.

The jig body 20 of the wafer boat shown in FIG. 3 is formed in a substantially semicylindrical shape, and has an inner peripheral surface of a side wall thereof formed with a plurality of (e.g. four) ridges 21a–21d in a vertical direction to support semiconductor wafers to be heat-treated. The side wall has a suitable number of windows 22a–22c formed therein between the ridges 21a–21d in order to prevent the jig body 20 from being failure due to a thermal shock and to make the jig body 20 lighter and decrease heat capacity of the wafer boat for effective heat transfer. The ridges 21a–21d have a plurality of wafer supporting grooves 23a–23b formed thereon, respectively.

The lower plate 30 is constituted by a first plate 31 coupled to the lower end of the jig body 20, a second plate 32 for placement on a table of a heat treatment furnace, and a hollow cylindrical member 33 coupling the first plate 31 and the second plate 32. A wafer boat constituted only by the first plate is generally used as well.

In the wafer boat 10, slits 24, 31b and 33b are formed to extend in a lower portion of the jig body 20, the first plate 31 and the second plate 32 of the lower plate 30, and the hollow cylindrical member 33 to cut out these members at a single location (the slit formed in the second plate 32 is not shown). These slits prevents the lower plate 30 from being broken due to thermal stress.

When a separate pedestal is arranged at the lower end of the conventional vertical wafer boats, the contacting surfaces between the lower surface of the wafer boat and the pedestal have a deposited film by CVD thereon, creating a problem in that removal of the deposited film causes fine dust particles to contaminate semiconductor wafers.

Although a so-called pedestal equipped wafer boat which has a lower surface provided with a pedestal does not involve such a problem, such a wafer boat creates problems in that the presence of the pedestal makes the wafer boat heavier and cumbersome, increases heat capacity to enlarge a change in temperature in a furnace when the wafer boat is put into the furnace, and particulates are likely to be caused due to a stay of a reaction gas in the pedestal.

SUMMARY OF THE INVENTION

It is an object of the present invention to solve those problems of the prior art, and to provide a vertical wafer boat having strength enough to withstand a thermal shock, having light weight and easy handling, making acid cleaning easy, and capable of minimizing a change in temperature in a furnace.

The foregoing and other objects of the present invention have been attained by providing a vertical wafer boat comprising a pair of annular end plates arranged at an upper position and a lower position; a plurality of bars connecting the end plates; and supporting grooves formed in the bars for receiving and supporting semiconductor wafers therein; wherein the end plates and the bars are formed in a unitality coupled/joined structure made of a material including silicon carbide as a main component, and having an entire length of not less than 800 mm; the end plates are unitary annular plate without a slit in a radial direction; and padding of silicon carbide is formed at a coupled/joined portion between an end plate and a bar so that the coupled/joined portion exhibits an obtuse corner.

The present invention also provides a vertical wafer boat comprising a pair of annular end plates arranged at an upper position and a lower position; a plurality of bars connecting the end plates; and supporting grooves formed in the bars for receiving and supporting semiconductor wafers therein; wherein the end plates and the bars are formed in an integrally coupled/joined structure made of a material including silicon carbide as a main component, and having an entire length of not less than 800 mm; and padding of silicon carbide is formed at a coupled/joined portion between an end plate and a bar.

In the vertical wafer boat according to the present invention, the respective upper and lower end plates are unitary annular plates and have no base, offering advantages in that the weight is light, handling is easy, and small heat capacity can minimize a change in temperature when the wafer boat is put into a furnace.

It has been held that it is essential to arrange a base on a lower end of a wafer boat to minimize a temperature difference between the temperature at an upper portion and the temperature at a lower portion of the wafer boat in order to decrease thermal stress due to temperature difference to prevent breakage. However, the present inventors have found that thermal stress can be prevented from concentrated by forming padding of silicon carbide so that the coupled/joined portion between an end plate and a bar exhibits an obtuse corner, and that breakage due to thermal stress can be prevented in a sufficient manner by having an entire length of not less than 800 mm even if the temperature difference between the upper portion and the lower portion of the wafer boat is hundreds of degrees centigrade.

Specifically, although the upper end plate is heated to a high temperature and is thermally expanded, the lower end plate is not almost expanded because it is at a low temperature. As a result, the bars which are supported in parallel with one another are deformed so as to have upper portions thereof spread. The thermal stress which is caused in the wafer boat by entry into and takeout from a furnace concentrates on the corner at the coupled/joined portion between an end plate and a bar. In accordance with the present invention, the corner at the coupled/joined portion between an end plate and a bar exhibits an obtuse angle to prevent the thermal stress from concentrating on the corner at the coupled/joined portion. In addition, it has been found that the boat can have an entire length of not less than 800 mm to release the degree of such deformation of the bar so as to sufficiently prevent the wafer boat from being broken due to the thermal stress.

In the wafer boat according to the present invention, it is preferable that the end plates have an inner diameter of the annular plates sized to be 30–80% of an outer diameter thereof and have a thickness of 4–15 mm. By forming the inner diameter within such a range, a reaction gas intake passage having a sufficient area can be ensured, and strength required for holding the bars in a one-piece construction can be also ensured. By giving a thickness within such a range to the annular plates, it is possible to ensure sufficient strength, keeping lightness, and to decrease heat capacity so as to minimize a change in temperature in a furnace when the boat is put in the furnace.

BRIEF DESCRIPTION OF THE DRAWINGS

The invention will be described by way of example and with reference to the accompanying drawings.

FIGS. 2(a) and (b) are enlarged cross-sectional views of the coupled/joined portions of different examples of the vertical wafer boat;

FIG. 3 is a perspective view of a conventional vertical wafer boat; and

DESCRIPTION OF THE PREFERRED EMBODIMENTS

Components of the wafer boat according to the present invention can be produced by a known method, using silicon carbide powder as a raw material. In a preferable mode, slurry wherein an organic binder is added to the silicon carbide powder is shaped to obtain green articles in predetermined forms by e.g. slip casting or extrusion. The green articles are cut when necessary, and are fired. After the sintered articles thus obtained are processed and jointed together, the sintered article have silicon impregnated thereinto, and is subjected to final processing to prepare components having intended shapes. Processing, jointing or impregnation of silicon may be carried out to the green articles.

Figure 1:
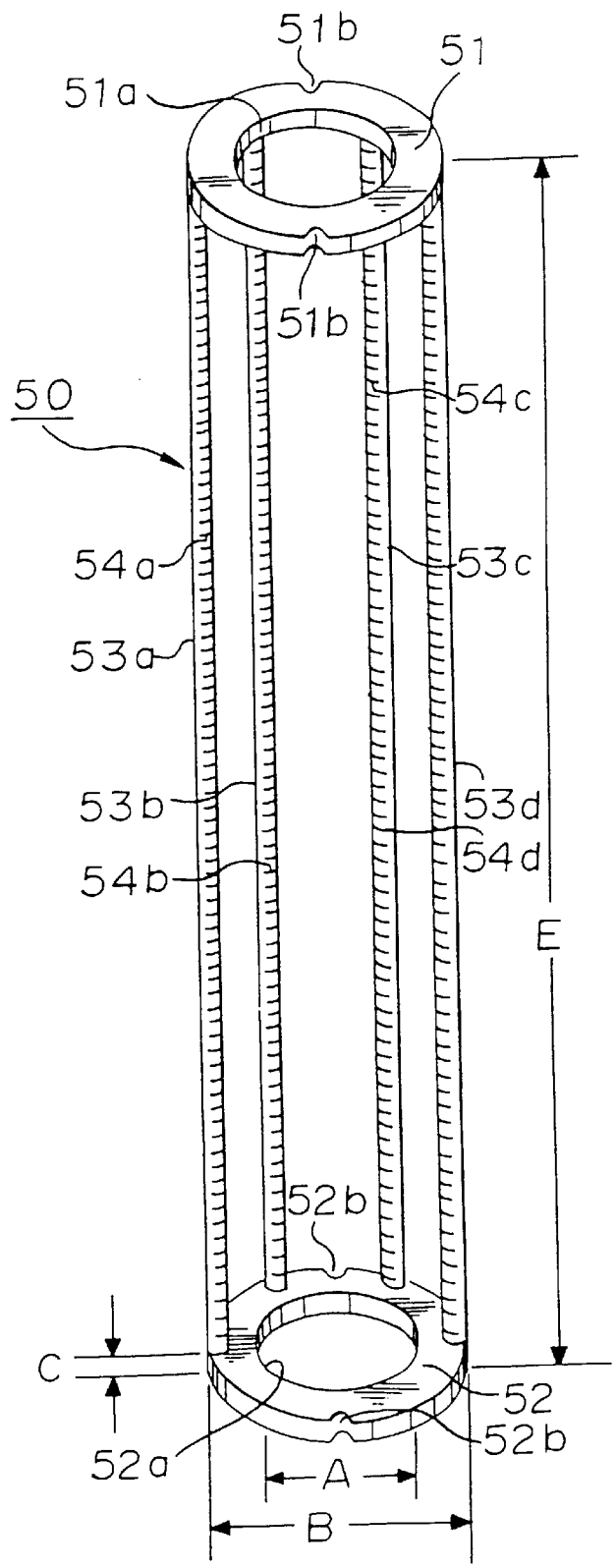
FIG. 1 is a perspective view of an embodiment of the vertical wafer boat according to the present invention.

In FIG. 1, there is shown a mode of the vertical wafer boat according to the present invention, which is prepared by joining members made of silicon carbide as explained above.

As shown in FIG. 1, the vertical wafer boat 50 includes a pair of annular end plates 51, 52 arranged at an upper position and a lower position, and plurality of bars connecting the end plates 51, 52, that is to say four bars 53a, 53b, 53c, 53d in the shown mode.

The upper end plate 51 and the lower end plate 52 have respective central portions formed with openings 51a, 52a, and the openings have arced notches 51b, 52b formed on peripheral surfaces at two opposite locations. In order to ensure strength and a light weight, it is preferable that the openings 51a, 52a have an inner diameter A sized to be 30–80% of an outer diameter B of the end plates 51, 52. In addition, it is preferable that the end plates 51, 52 have a thickness C of 4 15 mm. The shape of the end plates 51, 52 and that of the openings 51a, 52a must be not necessary circular, but e.g. an elliptic shape or a rectangular shape can be adopted, depending on requirements. However, it is preferable to adopt a round shape without an angular portion in order to prevent thermal stress from concentrating. Although the notches 51b, 52b are used for alignment when the wafer boat 50 is set in a low pressure CVD system and the like, the alignment may be carried out by using apertures formed in the end plates 51, 52 at a plurality locations. The end plate 51 or the end plate 52 may have a slit formed therein so as to extend from an outer peripheral surface to the opening 51a or the opening 52a.

The bars 53a, 53b, 53c, 53d are joined to the end plates 51, 52 along outer periphery thereof at predetermined distances so that semiconductor wafers can be inserted laterally. The bars 53a, 53b, 53c, 53d have numbers of supporting grooves 54a, 54b, 54c, 54d formed therein at respective corresponding positions in height at predetermined pitches from an upper position to a lower position in order to receive and support semiconductor wafers. Numbers of semiconductors wafers not shown are inserted into and supported by the supporting grooves 54a, 54b, 54c, 54d from the top to the bottom.

Heat adiabatic plates made of silicon carbide etc. or dummy wafers which are not shown are inserted into several supporting grooves 54a, 54b, 54c, 54d near to the upper and lower ends, and semiconductor wafers are inserted into supporting grooves other than the grooves near to the upper and lower ends where e.g. temperature condition is unlikely to be constant. The supporting grooves near to the upper and lower ends for receiving dummy wafers and heat adiabatic plates may be different from the supporting grooves at the intermediate position for receiving semiconductor wafers in terms of groove width or dimensional accuracy. The supporting grooves for receiving semiconductor wafers must be prepared by machining after firing the wafer boat because the groove width is relatively narrow and high dimensional accuracy is required. On the other hand, the supporting grooves for receiving heat adiabatic plates may be prepared in a green body because the groove width is relatively wide and high dimensional accuracy is not required.

The thickness of the bars 53a, 53b, 53c, 53d is set to provide sufficient strength, depending on the size of semiconductor wafers, the depth of the grooves, the height of the wafer boat and so on. Usually, it is preferable that the respective bars have a cross-sectional area of 65–250 mm$^2$.

It is preferable that the vertical wafer boat 50 has an entire length E of not less than 800 mm, in particular not less than 1,000 mm. The reason is that when the bars 53a, 53b, 53c, 53d are deformed by a temperature difference between an upper portion and a lower portion of the wafer boat, the bending stress can be decreased in a sufficient manner. When the bars 53a, 53b, 53c, 53d have a length of not less than 800 mm, the deformation can become gentle to decrease thermal stress which contributes failure due to the temperature gradient between the upper portion and the lower portion of the wafer boat when the wafer boat is applied to e.g. a low pressure CVD system or the like.

In FIGS. 2(a) and (b), there are shown two modes of the structure of a coupled/joined portion of the upper end plate 51 and one of the bars 53a, 53b, 53c, 53d (when the entire 4 bars are referred to, they will be called the bars 53 later on). It is preferable that the structure of the coupled/joined portions between the lower end plate 52 and the bars 53 have the same as those shown in FIGS. 2(a) or (b).

The end plate 51 has recesses 51c formed thereon for engagement with the bars 53. The upper ends of the bars 53 are inserted into the recesses 51c, a slurry-like adhesive 55 made of silicon carbide powder is applied to contacting surfaces and corners of the coupled/joined portions, assembling of the end plate and the bars is made, impregnation of molten silicon is made to couple the bars 53 and the end plate 51. It is preferable to use slurry with silicon carbide powder and an organic binder mixed in water as the adhesive agent 55. In order to concrete the slurry, there is a way to concrete the slurry by firing it after application of it, or a way to couple the end plate 51 and the bars 53 in a green body and then to impregnate the molten silicon into them.

The adhesive agent 55 including silicon carbide is applied to form padding at the corners of the end plate 51 and the bars 53 so that the coupled/joined portions exhibits an obtuse corner. It is preferable that the padding has a vertical cross-sectional shape of a right triangle, and the angle θ included between the bottom of the triangle and a bar is obtuse as shown in FIG. 2(a). In particular, the angle θ is highly recommended to be not less than 110°. It is preferable that the cross-sectional area of the triangle is within a range of 1–15 mm$^2$. Because the thermal stress is insufficiently released in case of cross-sectional area of less than 1 mm$^2$, and because gas flow is inhibited in case of cross-sectional area of more than 15 mm$^2$, a cross-sectional area outside the range is not recommended.

In another mold, the padding has a vertical cross-sectional shape formed to be arced, and the padding has an outer concave surface arranged to be tangent to the surface of the end plate and to the surface of the bars as shown in FIG. 2(b). In this mode, it is preferable that the outer concave surface has an arc of a radius of 2–5 mm.

Although the padding is preferably formed at the corners of all coupled/joined portions between the bars and the end plate, the padding may be formed at only some of the corners, depending on requirements.

Figure 4:
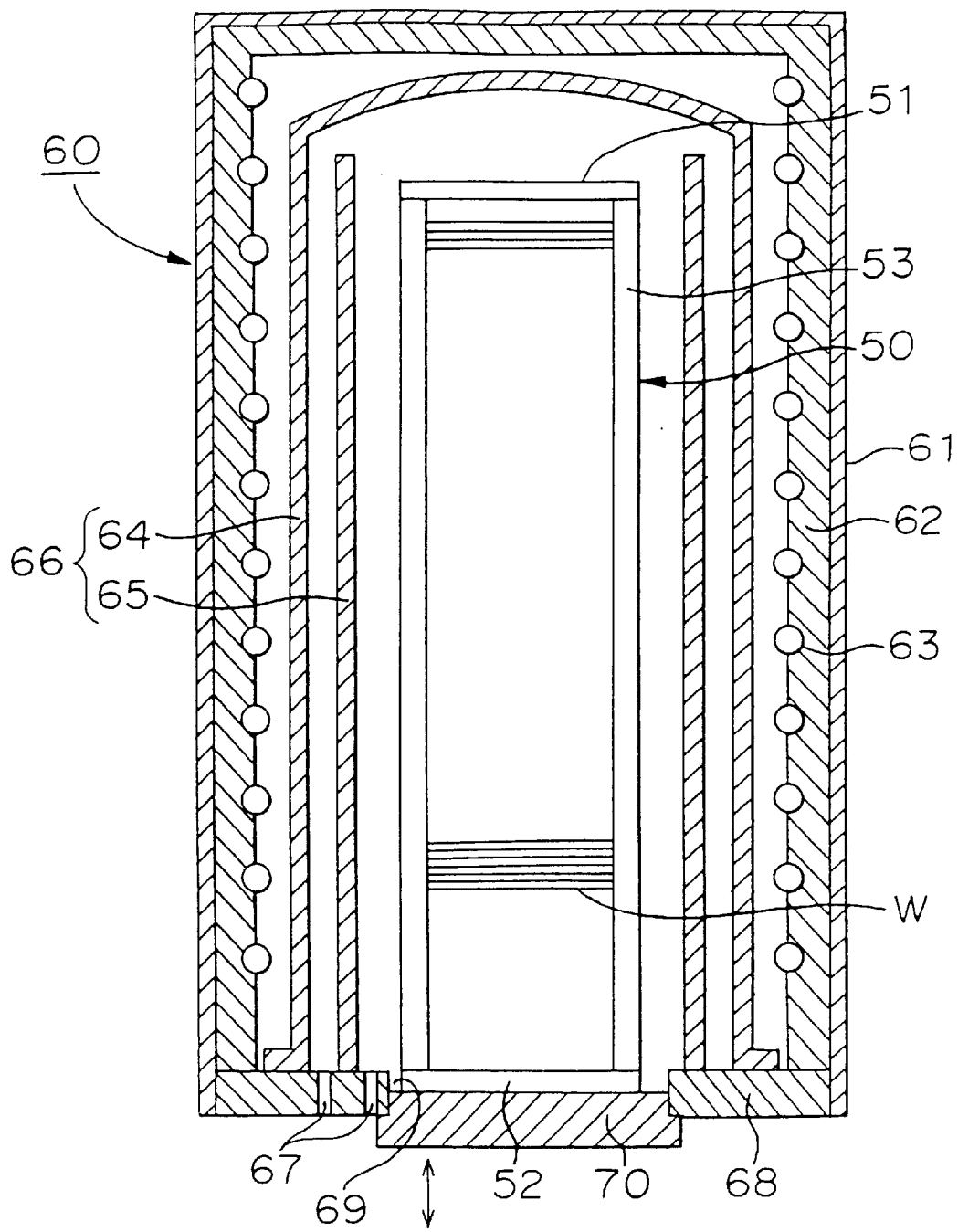
FIG. 4 is a vertical cross-sectional view of a low pressure CVD system to which the vertical wafer boat according to the present invention is applied.

In FIG. 4, there is shown an example wherein the vertical wafer boat 50 according to the present invention is put in a low pressure CVD system 60.

The low pressure CVD system 60 includes a metallic housing 61, a heat insulating material 62 stuck on the inner surface of the housing, and a heater 63 embedded in and arranged in the inner periphery of the heat insulating material 62. The metallic housing 61 has a dual tube 66 comprising an outer tube 64 and an inner tube 65 arranged therein. The lower opening between the metallic housing 61 and the dual tube 66 is hermetically closed by a holder 68. A metallic lid 70, which is vertically moved by a driving unit not shown, is arranged in an inlet 69 of the holder 68 so as to open and shut the inlet. The wafer boat 50 is put on the lid 70. The wafer boat 50 has numbers of semiconductor wafers W received and supported therein.

The holder 68 has a gas feed aperture 67 and a gas exhaust aperture 67 formed therein. The holder 68 has a water jacket (not shown) arranged therein to prevent the holder 68 from being thermally damaged.

The wafer boat 50 with numbers of semiconductor wafers W received and supported therein is put on the lid 70, and is put in the low pressure CVD system 60 by lifting the lid 70. When film deposition is completed, the lid 70 is lowered to take out the wafer boat 50 from the low pressure CVD system 60. The wafer boat 50 is subjected to a heat cycle which is created by the reciprocation between the inside of the low pressure CVD system 60 at a high temperature and an exterior thereof at a low temperature. When the wafer boat is put in the low pressure CVD system 60, the wafer boat is subjected to thermal stress which is caused by a great temperature gradient between the lower portion near to the holder 68 kept at a low temperature by the water jacket, and the upper portion heated to 400–850° C. by the heater 63. In accordance with the wafer boat of the present invention, the arrangement as stated earlier makes it possible to resist the heat cycle and the thermal stress in a sufficient manner.

EXAMPLE

Slurry which was prepared by mixing 75 wt % of silicon carbide powder, 7 wt % methyl cellulose as the organic binder, and 18 wt % of water was shaped in a gypsum mold by slip casting, and then the shaped slurry is cut to obtain end plates and bars in a green body. The end plates and the bars were engaged, keeping such a green body, and an adhesive agent which was made of slurry similar to the one used for preparation of the end plates and the bars was applied to the coupled/joined portions between the end plates and the bars. Then, 60 minutes of firing was carried out at 1,800° C. to obtain a sintered article made of silicon carbide. Silicon was impregnated into the sintered silicon carbide article according to a conventional way as disclosed in e.g. U.S. Pat. No. 5,179,099, and grooves and so on are finally machined to prepare the wafer boat 50 shown in FIG. 1.

In the wafer boat 50, the openings of 51a, 52a in the end plates 51, 52 had an inner diameter A of 100 mm, and the end plates 51, 52 had an outer diameter B of 230 mm and a thickness C of 5 mm. The bars 53a, 53b, 53c, 53d had a length of 1,190 mm and a thickness of 12 mm×17 mm (a cross-sectional area of 204 mm$^2$). The wafer boat had an entire length E of 1,200 mm. The padding as shown in FIG. 2(b) had a vertical cross-sectional shape in an arced form, and had a radius R of about 4 mm.

The wafer boat 50 was put into a low pressure CVD system which was constructed as shown in FIG. 4 and was kept at 800° C. Although operations for film deposition by CVD were carried out twice, it was found that there were no breakage due to thermal stress. Handling of the wafer boat was easy and acid cleaning of the wafer boat was also easy in comparison with conventional base equipped wafer boats because the wafer boat had a simple and light structure.

In order to check whether the wafer boat according to the present invention was durable even after numbers of repeated use, a temperature change at different portions of the wafer boat was measured when the wafer boat was put into the low pressure CVD system. The finite element method was applied to calculate the maximum expansion stress which was estimated to occur. The calculation estimated that the maximum expansion stress occurred at the corners of the coupled/joined portions and its value was 1.5 kg/mm². It was found that repeated expansion stress brought about no damage due to thermal stress because the maximum expansion stress was quite small in comparison with the rupture strength of silicon carbide material of 23 kg/mm². The material characteristics which were used for calculation based on the finite element method were as follows. Elastic modulus: $3.5 \times 10^4$ kg/mm², Poisson's ratio: 0.24, specific heat: 0.14 cal/g° C., thermal conductivity: 50 kcal/m·hr·° K., coefficient of thermal expansion: $4.5 \times 10^{-6}$/° C., density: 3.0 g/cm³.

As explained, the vertical wafer boat according to the present invention has the upper and lower end plated constituted by unitary annular plates and has no pedestal. As a result, the wafer boat can offer advantages in that the weight is light and handling is easy, and that the temperature change in a furnace can be minimized when the wafer boat is put in the furnace. In addition, the corner at a coupled/joined portion between an end plate and a bar has padding of silicon carbide formed thereon, and the entire strength of the wafer boat is not less than 800 mm. As a result, even if the temperature difference between an upper portion and a lower portion of the wafer boat becomes hundreds of degrees centigrade, it is possible to avoid thermal stress and breakage due to concentration of the thermal stress in a sufficient manner. Even if the wafer boat is repeatedly put in a heat treatment furnace such as a low pressure CVD system, the wafer boat has sufficient durability. Further, because the wafer boat has no pedestal and has a simple structure, the preparation yield of wafer boats is improved, acid cleaning become easy, and occurrence of particle. As little.

What is claimed is:

1. A vertical wafer boat comprising:
   a pair of annular end plates arranged at an upper position and a lower position;
   a plurality of bars connecting the end plates; and
   supporting grooves formed in the bars and configured to receive and support semiconductor wafers therein;
   wherein the end plates and the bars comprise an integrally coupled structure having a material including silicon carbide as a main component, and having an entire length of not less than 800 mm,
   wherein the end plates are unitary annular plates without a slit in a radial direction, and
   wherein padding of silicon carbide is formed at a coupled portion between a respective end plate and bar so that the coupled portion exhibits an obtuse corner.

2. A vertical wafer boat according to claim 1, wherein the end plates have an inner diameter of 30–80% of an outer diameter thereof and have a thickness of 4–15 mm.

3. A vertical wafer boat comprising:
   a pair of annular end plates arranged at an upper position and a lower position;
   a plurality of bars connecting the end plates; and
   supporting grooves formed in the bars and configured to receive and support semiconductor wafers therein,
   wherein the end plates and the bars comprise an integrally coupled structure having a material including silicon carbide as a main component, and having an entire length of not less than 800 mm, and
   wherein padding of silicon carbide is formed at a coupled portion between a respective end plate and bar.

4. A vertical wafer boat according to claim 3, wherein an adhesive which comprises slurry containing silicon carbide and a binder is applied to a corner at the coupled portion between the respective end plate and bar, and the adhesive is fired to form the padding.

5. A vertical wafer boat according to claim 4, wherein the respective end plate and bar have a material including unfired silicon carbide as a main component, and the respective end plate, the bar and the adhesive are simultaneously fired.

6. A vertical wafer boat according to claim 3, wherein the padding has a vertical cross-sectional shape of a right triangle, and the triangle has a bottom arranged with respect to the respective bar at an obtuse angle.

7. A vertical wafer boat according to claim 6, wherein the padding has an average cross-sectional area of 1–15 mm².

8. A vertical wafer boat according to claim 3, wherein the padding has a vertical cross-sectional shape formed to be arced so as to present an outer concave surface, and the outer concave surface has an arc of a radius of 2–5 mm.

9. A vertical wafer boat according to claim 5, wherein silicon is impregnated after firing.

10. A vertical wafer boat according to claim 3, wherein the padding is formed on at least one of the coupled portions between the upper plate and the bars.

11. A vertical wafer boat according to claim 3, wherein the padding is formed on at least one of the coupled portions between the lower plate and the bars.

12. A vertical wafer boat according to claim 3, wherein at least one of the upper plate and the lower plate has a slit formed therein in a radial direction.

13. A vertical wafer boat according to claim 3, wherein the entire length is not less than 1000 mm.

14. A vertical wafer boat according to claim 3, wherein the bars have a cross-sectional area of 65–250 mm².

15. A vertical wafer boat according to claim 3, wherein the boat is used in a low pressure CVD system.

16. A vertical wafer boat comprising:
   a pair of annular end plates arranged at an upper position and a lower position; and
   a plurality of bars connecting the end plates and including supporting grooves configured to receive and support semiconductor wafers,
   wherein the end plates and the bars comprise a coupled structure and include a material having silicon carbide as a main component, and
   wherein at least one reinforcing member of silicon carbide is formed at at least one contact portion between one of the end plates and one of the bars, the reinforcing member being in contact with said one of the bars and said one of the end plates.

17. A vertical wafer boat according to claim 16, wherein the end plates have an inner diameter of 30–80% of an outer diameter thereof and have a thickness of 4–15 mm.

18. A vertical wafer boat according to claim 16, wherein the end plates comprise annular plates without a slit in a radial direction and the at least one reinforcing member comprises an obtuse angle in a plane extending longitudinally and radially from the one of the bars in contact with the reinforcing member and between a surface of the one of the plates in contact with said reinforcing member.

19. A vertical wafer boat according to claim 16, wherein the reinforcing member has, in a plane extending radically and longitudinally to the one of the bars in contact with said reinforcing member, a cross-sectional shape of a rightangled triangle, and wherein an angle between said one of the bars and an outer side of a hypotenuse of a triangle in said plane is an obtuse angle.

20. A vertical wafer boat according to claim 19, wherein the reinforcing member has an average cross-sectional area in said plane of 1–15 mm$^2$.

21. A vertical wafer boat according to claim 16, wherein the reinforcing member has, in a plane extending radially and longitudinally to the one of the bars in contact with said reinforcing member, a cross-sectional shape having a concave side arched inwardly towards the contact portion, and wherein an outer surface of the concave side comprises a radius of curvature of 2–5 mm.

22. A vertical wafer boat according to claim 16, wherein the at least one contact portions is a contact portion between the upper plate and the one of the bars.

23. A method of manufacturing a vertical wafer boat, comprising the steps of:

arranging a pair of annular end plates at upper and lower positions;

connecting a plurality of bars to the annular end plates;

forming supporting grooves in the plurality of bars for receiving and supporting semiconductor wafers;

coupling the annular end plates and the plurality of bars with a material including silicon carbide as a main component; and forming at least one reinforcement member of silicon carbide at at least one contact portion between a respective annular end plate and bar, wherein the reinforcement member contacts the respective annular end plate and bar.

24. The method according to claim 23, wherein the step of forming at least one reinforcement member comprises the steps of:

applying an adhesive comprising a slurry having silicon carbide and a binder to the at least one contact portion; and firing the adhesive applied in the applying step so as to form the at least one reinforcement portion.

25. The method according to claim 23, further comprising the steps of forming the annular end plates and the plurality of bars with a material comprising unfired silicon carbide as a main component; and simultaneously firing the annular end plates, the plurality of bars, and the adhesive.

26. The method according to claim 23, further comprising the step of impregnating silicon in the annular end plates, the bars and the reinforming member.

* * * * *